US011680333B2

(12) United States Patent
Sudarshan et al.

(10) Patent No.: US 11,680,333 B2
(45) Date of Patent: Jun. 20, 2023

(54) DEFECT ENGINEERED HIGH QUALITY MULTILAYER EPITAXIAL GRAPHENE GROWTH WITH THICKNESS CONTROLLABILITY

(71) Applicant: University of South Carolina, Columbia, SC (US)

(72) Inventors: Tangali S. Sudarshan, Columbia, SC (US); Tawhid Rana, Columbia, SC (US); MVS Chandrashekhar, Columbia, SC (US)

(73) Assignee: University of South Carolina, Columbia, SC (US)

( * ) Notice: Subject to any disclaimer, the term of this patent is extended or adjusted under 35 U.S.C. 154(b) by 1454 days.

(21) Appl. No.: 14/767,095

(22) PCT Filed: Feb. 14, 2014

(86) PCT No.: PCT/US2014/016445
§ 371 (c)(1),
(2) Date: Aug. 11, 2015

(87) PCT Pub. No.: WO2014/127218
PCT Pub. Date: Aug. 21, 2014

(65) Prior Publication Data
US 2015/0368827 A1    Dec. 24, 2015

Related U.S. Application Data

(60) Provisional application No. 61/850,414, filed on Feb. 14, 2013.

(51) Int. Cl.
*B32B 9/00* (2006.01)
*C30B 1/10* (2006.01)
(Continued)

(52) U.S. Cl.
CPC .............. *C30B 1/10* (2013.01); *C01B 32/188* (2017.08); *C30B 1/02* (2013.01); *C30B 29/02* (2013.01);
(Continued)

(58) Field of Classification Search
CPC ............ C01B 31/0438; C01B 31/0446; C01B 31/0453; C01B 2204/00; B82Y 30/00; Y10T 428/30
(Continued)

(56) References Cited

U.S. PATENT DOCUMENTS 6,579,833 B1   6/2003   McNallan et al.
7,061,021 B2   6/2006   Sudarshan et al.
(Continued)

FOREIGN PATENT DOCUMENTS

WO    WO 2014/127218    8/2014

OTHER PUBLICATIONS

Presser et al., "Carbide-Derived Carbons—From Porous Networks to Nanotubes and Graphene," Advanced Functional Materials, vol. 21, No. 5, Mar. 8, 2011, pp. 810-833.
(Continued)

*Primary Examiner* — Daniel H Miller
(74) *Attorney, Agent, or Firm* — Dority & Manning, P.A.

(57) ABSTRACT

Methods for forming a graphene film on a silicon carbide material are provided, along with the resulting coated materials. The method can include: heating the silicon carbide material to a growth temperature (e.g., about 1,000° C. to about 2,200° C.), and exposing the silicon carbide material to a growth atmosphere comprising a halogen species. The halogen species reacts with the silicon carbide material to remove silicon therefrom. The halogen species can comprise fluorine (e.g., $SiF_4$, etc.), chlorine (e.g., $SiCl_4$), or a mixture thereof.

12 Claims, 8 Drawing Sheets

(51) Int. Cl.
  *C01B 32/188*    (2017.01)
  *C30B 1/02*      (2006.01)
  *C30B 29/02*     (2006.01)
  *B82Y 30/00*     (2011.01)

(52) U.S. Cl.
  CPC ........... *B82Y 30/00* (2013.01); *C01B 2204/04* (2013.01); *Y10T 428/30* (2015.01)

(58) Field of Classification Search
  USPC .......................................... 428/408; 423/448
  See application file for complete search history.

(56) References Cited

U.S. PATENT DOCUMENTS

| | | |
|---|---|---|
| 7,220,978 B2 | 5/2007 | Ma et al. |
| 9,644,288 B2 | 5/2017 | Sudarshan et al. |
| 9,782,846 B2 | 10/2017 | Sudarshan et al. |
| 9,842,898 B2 | 12/2017 | Sudarshan et al. |
| 9,966,491 B2 | 5/2018 | Chandrashekhar et al. |
| 2010/0276699 A1 | 11/2010 | Zhao et al. |
| 2012/0156424 A1 | 6/2012 | Chen et al. |
| 2015/0368827 A1 | 12/2015 | Sudarshan et al. |

OTHER PUBLICATIONS

Peng, "Direct Transformation of Amorphpous Silicon Carbide into Graphene Low Temperature and Ambient Pressure," Scientific Reports, Jan. 28, 2013, pp. 1-7.
Chowdhury, et al., "High growth rate 4H-SiC epitaxial growth using dichlorosilane in a hot-wall CVD reactor," *Cornell University Materials Science*, (2010), pp. 1-30, doi: 10.1016/j.jcrysgro.2010.11.128.
Cicala, et al. Plasma deposition of amorphous SiC:H,F alloys from SiF4CH4H2 mixtures under modulated conditions, *J. Appl. Phys.* 79, (1996), pp. 8856-8858. doi: 10.1063/1.362473.
Daas, et al., "Comparison of epitaxial graphene growth on polar and non-polar 6H-SiC faces: On the growth of multilayer films" *Crystal Growth and Design*, 12, (202), pp. 3379-3387.
Daas, et al., "Molecular Gas Adsorption Induced Carrier Transport Studies of Epitaxial Grapheneusing IR Reflection Spectroscopy," *Mat. Sci. For.*, (2012); 717-720, pp. 665-668.
Daniels, et al., "Evidence of Electrochemical Graphene Functionalization by Raman Spectroscopy", *Mat. Sci. For.* 7, (2012); 17-720, pp. 661-664.
Drowart, et al. "Thermodynamic Study of SiC Utilizing a Mass Spectrometer," *Journal of Chemical Physics*, 29, (1958), pp. 1015-1021.
Dubois, et al, "A carbonaceous chemical filter for the selective detection of NO2 in the environment" *Carbon*, 52, (2013), pp. 17-29.

Emtsev, et al. "Towards wafer-size graphene layers by atmospheric pressure graphitization of silicon carbide," *Nat. Mater.* 8, (2009), pp. 203-207.
Ganguly, et al. "Polycrystalline silicon carbide films deposited by low power radiofrequency plasma decomposition of SiF4CF4H2 gas mixtures," *J. Appl. Phys.* 69, (1991), pp. 3915-3923.
Gutmann, V. "Halogen Chemistry," Academic press, 1967.
Itoh, et al. "High quality 4HSiC homoepitaxial layers grown by step controlled epitaxy," *Appl. Phys, Lett.* 65, (1994), pp. 1400-1402. doi: 10.1063/1.112064.
Janaf thermo-chemical data book (http://kinetics.nist.gov/janaf/) (Web).
Kawashima, et al., "Fundamentals, overtones, and combinations in the Raman spectrum of graphite" *Phys. Rev. B*, 52, (1995), pp. 10053-10059.
Kida, et al. "Growth and Characterization of SiC Films by Hot-Wire Chemical Vapor Deposition at Low Substrate Temperature Using SiF4/CH4/H2 Mixture," *Japanese Journal of Applied Physics*, 47(1), (2008), pp. 566-568.
Kumagawa, et al. "Hydrogen etching of silicon carbide," *Japanese Journal of Applied Physics 8* (1969), pp. 421-428.
Lavia, et al. "4H-SiC epitaxial layer growth by trichlorosilane (TCS)," *Journal of Crystal Growth* 311 (2008), pp. 107-113.
Li, et al. "Large-Area Synthesis of High-Quality and Uniform Graphene Films on Copper Foils" *Science*, 324, (2009), pp. 1312-1314.
Lin, et al. "JOO-GHz Transistors from Wafer-Scale Epitaxial Graphene" *Science*, 327, (2010), p. 662.
Oshima, et al., "Ultra-thin epitaxial films of graphite and hexagonal boron nitride on solide surfaces" *J. Phys.: Condens. Matt.*, 9, (1997), pp. 1-20.
Pedersen, et al., "Growth characteristics of chloride-based SiC epitaxial growth" *PSS Rap. Rev. Lett.*, 2, (2008), 278.
Pedersen, et al. "Very high growth rate of 4H-SiC epilayers using the chlorinated precursor methyltrichlorosilane (MTS)," *Journal of Crystal Growth*, 307(2), (2007), pp. 334-340. ISSN 0022-0248, 10.1016/j.jcrysgro.2007.07.002.
Rana, et al., "Elimination of silicon gas phase nucleation using silicon tetrafluoride (SiF4) chemistry for high quality thick SiC homoepitaxy" *Phys. Stat. Solid A*, 209(12), pp. 2455-2462. DOI: 10.1002/pssa.201228319.
Rana, et al., "Behavior of Particles in Growth Raactor and Their Effect on Silicon Carbide Epitaxial Growth" *Material Science Forum*, 717-720, (2012), pp. 153-156.
Robinson, et al. "Correlating Raman Spectral Signatures with Carrier Mobility in Epitaxial Graphene: A Guide to Achieving High Mobility on the Wafer Scale," *Nano Letters* 9(8), (2009), pp. 2873-2885.
Talukdar, et al., "Aerosol dynamics modeling of silicon nanoparticle formation during silane pyrolysis: a comparison of three solution methods," *Aerosol Science* 35, (2004), pp. 889-908.
Timms, et al., "Silicon-Fluorine Chemistry. I. Silicon Difluoride and the Perfluorosilanes," *J. of the American Chem. Society* 87(13), (1965), pp. 2824-2828.

DEFECT ENGINEERED HIGH QUALITY MULTILAYER EPITAXIAL GRAPHENE GROWTH WITH THICKNESS CONTROLLABILITY

PRIORITY INFORMATION

The present application claims priority to U.S. Provisional Patent Application Ser. No. 61/850,414 titled "Method of Growing High Quality Epitaxial Graphene with Thickness Controllability" of Sudarshan, et al. filed on Feb. 14, 2013, the disclosure of which is incorporated by reference herein.

GOVERNMENT SUPPORT CLAUSE

This invention was made with government support under N00014-10-1-0530 awarded by the Office of Naval Research. The government has certain rights in the invention.

BACKGROUND

Graphene is a novel nanomaterial boasting several remarkable properties, such as massless electronic transport (for high speed electronics), high Young's modulus (for mechanical devices), single molecule sensitivity to emissions gases, among others. These properties have been attributed to graphene's single atomic layer structure, compared to bulk graphite, which has multiple layers. However, if these properties could be translated into a thicker form factor, the range of applications for this material would be expanded significantly, particularly applications where bulk graphite has played a large role e.g., batteries, fuel cells etc. The earliest ways to synthesize graphene were crude, and could only produce single layers of small area, typically less than 100 µm in size, although this led to the 2010 award of the Nobel Prize. Subsequently, several other techniques have been perfected.

Graphene growth can be performed by exfoliation of bulk graphite, reduction of graphite oxide, chemical vapor deposition on metal and transition metal carbide substrates, and Si sublimation of SiC. For commercialization in electronic applications, it is essential to grow graphene on large areas using a simple and reliable manner with uniform control of electronic properties such as carrier mobility. In this light, the best quality material has been obtained through the solid-state decomposition of the surface of a commercial SiC substrate. In this technique, the substrate is heated to high temperatures (such as between about 1300° C. and 1650° C., either in a vacuum, or in an inert environment (such as argon). The Si vapor pressure at the surface, being higher than that of carbon, leads to the loss of Si from the surface, and the formation of a C-rich layer on the SiC surface according to the reaction (1).

$$SiC(s) \rightarrow Si(g) + C(s) \quad (1)$$

This C-rich layer can then rearrange itself into a perfect graphene crystal, if enough time is available for the bonds to form. The thickness is controlled by changing the temperature and time, as well as the choice of SiC substrate orientation. It was then shown that the best quality material could be obtained by slowing down the growth rate, allowing the C-rich layer to form complete C—C bonds and form a good quality graphene crystal. If the formation rate of the C-rich layer is too fast, a good quality crystal cannot be formed.

The growth can be slowed down by using a high pressure inert ambient (such as about 1 atmosphere), leading to Boltzmann transport near the surface as opposed to Knudsen transport. Another method is to use close-confinement of the SiC crystal, providing a small volume to achieve the equilibrium for the reaction in (1), which essentially slows down the reaction to a stop, apart from parasitic losses through controlled leaks in the growth reactor. Both techniques enable the growth to be slowed down and/or be performed at a higher temperature, providing more time and energy for the formation of a good quality crystal.

However, the present inventors have shown that the growth of multilayer films must be mediated by the defects in the individual epitaxial graphene films, as a perfect graphene layer cannot allow further Si-atoms to diffuse through it and out of the growth region, which is a necessary step for the formation of a subsequent C-rich layer. Thus, a fundamental trade-off exists in the production of high-quality graphene growth: crystal quality vs. crystal thickness. The present inventors have also shown that the growth occurs at the SiC/graphene interface at the bottom of the graphene film, requiring the presence of a defect to allow the Si-atoms to diffuse through the graphene film formed.

While graphene growth has focused on producing 1-2 atomic monolayers (ML) for radio frequency (RF) applications, there is an emerging need for thicker layers for engineered carbon electrodes for batteries, hydrogen storage, emissions sensing, fuel cells etc., where accessible surface area is critical. These thicker layers can, in some cases if properly controlled, behave as decoupled independent graphene layers, providing the electronic benefits required. However, based on the summary above, there exists a fundamental trade-off that must be broken in order for high quality thick layers of epitaxial graphene to be grown. As such, a need exists for a method of growing a thick graphene layer having controlled defects therein.

SUMMARY

Objects and advantages of the invention will be set forth in part in the following description, or may be obvious from the description, or may be learned through practice of the invention.

Methods are generally provided for forming a graphene film on a silicon carbide material. In one embodiment, the method includes: heating the silicon carbide material to a growth temperature, and exposing the silicon carbide material to a growth atmosphere comprising a halogen species. The growth temperature can be about 1,000° C. to about 2,200° C. (e.g., about 1,300° C. to about 1,600° C.).

Generally, the halogen species reacts with the silicon carbide material to remove silicon therefrom. The halogen species can comprise fluorine (e.g., $SiF_4$, etc.), chlorine (e.g., $SiCl_4$), or a mixture thereof. In particular embodiments, the growth atmosphere is substantially free from any hydrogen species and/or any oxygen species. In one particular embodiment, the growth atmosphere consists essentially of the halogen species and at least one inert gas (e.g., selected from the group consisting of Ar, He, Xe, $N_2$, and mixtures thereof).

In certain embodiments, the silicon carbide material can be heated in an inert gas atmosphere without any halogen species present. That is, in such embodiments, the silicon carbide material is first heated in an inert atmosphere, and then, once at the growth temperature, exposed to the halogen species.

Through these methods, a graphene film having a thickness of a single graphene layer or a plurality of graphene layers (i.e., a multilayer graphene film) can be formed on the surface of the silicon carbide material. For instance, the multilayer graphene film can have a thickness that is about two graphene films to about 1 mm (e.g., two graphene films to about 1 µm).

The resulting silicon carbide material having the graphene film thereon is also provided.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures.

FIG. 1A shows an atomic model of the un-decomposed $SiF_4$ reacting with Si atoms in the SiC surface, FIG. 1B shows an atomic model of each $SiF_4$ molecule liberating one Si atom by forming $2SiF_2$ (gas), and FIG. 1C shows the formation of a graphene layer on the SiC surface through continued removal of Si.

FIG. 3A shows the result of growth with 2 slm of Ar and 10 sccm of $SiF_4$ for 60 minutes and FIG. 3B shows the result of growth with 10 slm of Ar and 10 sccm of $SiF_4$ for 1 minute.

Figure 1C:
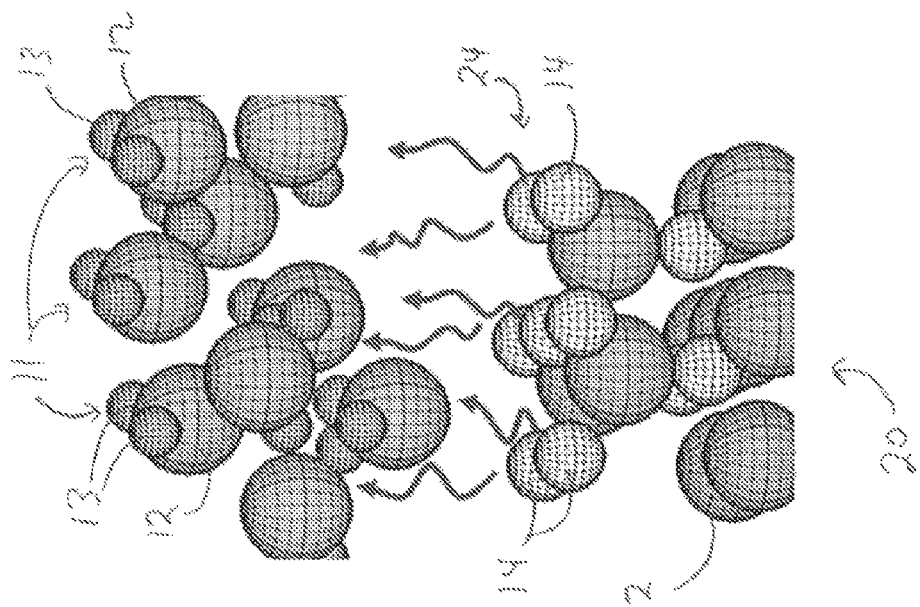
FIGS. 1A-1C show an atomic model of epitaxial graphene growth, through chemically accelerated silicon removal using an exemplary halogen gas ($SiF_4$), where

Repeat use of reference characters in the present specification and drawings is intended to represent the same or analogous features or elements of the present invention.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

As used herein, the term "graphene" or "graphene layer" refers to a 2-dimensional, crystalline allotrope of carbon. In graphene, carbon atoms are densely packed in a regular $sp^2$-bonded atomic-scale hexagonal pattern. Conversely, the term "multilayer graphene film" refers to a carbon material that includes a plurality of graphene layers. Thus, a graphene layer can be described as a one-atom thick layer of a "multilayer graphene."

Methods are generally provided for growing a multilayer graphene film (MLG) with controllability of thickness and electronic properties. For example, methods are generally provided to form a relatively thick multilayer graphene film on a silicon carbide material while controlling the quality of the film (i.e., the presence or absence of defects in the multilayer graphene film). In one embodiment, the method relies on changing the silicon loss mechanism from equation (1) above to equation (2), in section below, that the typical trade-off of thickness vs. quality can be broken. Thus, methods are generally presented where the growth of individual graphene layers can be performed to form the multilayer graphene film with the potential for controlling both thickness and material quality simultaneously, breaking the traditional trade-offs in epitaxial MLG growth. This advance is enabled by the use of novel halogenated precursors, particularly fluorine-containing precursors.

In one particular embodiment, the methods described herein enable the formation of graphene epilayers by utilizing a halogen species in the system (e.g., $SiF_4$ gas as precursor gas) in a hotwall CVD reactor. These methods can achieve thin (e.g., a single graphene layer) to thick multilayer graphene film (formed from a plurality of graphene epilayers) with excellent surface morphology and uniformity, grown at various growth rates, the combination of which is not attainable by using other techniques, as explained in the background section above.

The applications of such multilayer graphene films on SiC materials are numerous, and can be utilized in most applications where a SiC material is present. For example, such materials can be utilized to form electrodes for use in batteries, fuel cells, nanoelectronics, etc.; metallurgical coatings; templates for organic synthesis (e.g., 2D hydrocarbons); SiC reinforcement fibers/whiskers; LED manufacturing, etc.

The process of graphene epitaxial growth on SiC is described in the following sections in greater detail. In general, a silicon carbide material is, according to a preferred embodiment, (a) heated to a reaction temperature such that silicon atoms begin to liquefy while carbon atoms remain in the solid state and (b) exposed to a halogen species to chemically accelerate removal of the liquefied Si atoms from the surface.

I. Silicon Carbide Material

A multilayer graphene film can be formed on any material having exposed silicon carbide, regardless of the physical form or shape, according to the methods described herein. For example, the silicon carbide material can be a substrate (e.g., wafer), powder, particle (e.g., nanoparticle), wire, whisker, etc. Similarly, the silicon carbide material can have any crystalline structure, such as poly-crystalline, single-crystalline, nano-crystalline, etc.

The methods discussed herein can be utilized to form a multilayer graphene film on any off cut substrate. That is, by using a halogen species (e.g., $SiF_4$), epitaxial growth of MLG film can be performed with any off cut substrate (e.g. 0°, 2°, 4°, 8° etc) or any polytype (3C, 4H, 6H etc.) since a Si removal process is enhanced irrespective of the substrate type (orientation, polytype etc.). This chemistry is applicable to any growth reactor (e.g. horizontal, vertical etc.) since the basic principle remains same for any reactor geometry.

In one embodiment, the silicon carbide material is a silicon carbide coating on another material. For example, the silicon carbide coating can be on a semiconductor or metal substrate. For example, metals for metallurgical applications can have a silicon carbide coating (e.g., steel drill bits, etc.).

II. Heating the Silicon Carbide Material

The SiC material is heated to a growth temperature during the method of the present invention. Suitable growth temperatures are sufficient to dissociate Si from the surface of the SiC material. For example, the growth temperature can be from about 1,000° C. to about 2,200° C., such as about 1,300° C. to about 1,600° C.

The partial pressure of Si is more than 10 times higher than that of SiC in silicon carbide at typical growth temperatures. As such, when SiC is heated to such growth temperatures in any inert gas environment (e.g. Ar, He, Xe, $N_2$, etc. or mixtures thereof), Si dissociates from the SiC material to form a liquid, and eventually evaporates, leaving carbon layer(s) on the surface of the SiC material. Thus, the growth of epitaxial graphene on SiC in the regular process, as explained in the background section above, is dependent on the removal of Si from the surface. This thermal removal process is slow since the liquid Si on the surface must be removed as Si gas by slow self-evaporation process. This process is slowed further by the diffusion through the growing graphene film, which allows diffusion only through defect sites.

To grow graphene in a more predictable manner with greater controllability of defect profile, a controllable Si removal process by some precursor gas is essential. Ar itself does not remove Si from the surface since it does not react with Si or SiC.

III. Chemically Controlled Removal of the Silicon Atoms

In general, any halogen in the system, especially fluorine, reacts with Si of the heated SiC and enhances liberation and dissociation of Si from the surface by forming gaseous $SiX_2$, where X is a halogen (e.g., F, Cl, etc.). As a result, excess carbon remains on the surface, and rearranges into a graphene epilayer while at the growth temperature. The rearrangement of the C-rich layer into a plurality of graphene layers (to form a multilayer graphene film), as well as the diffusive transport of the Si-removing species to and away from the SiC/graphene growth interface may also be mediated by the halogen-containing species. For example, C—F (similar to Teflon) bonds have the potential to form at this temperature, and as with Teflon, C—F bonds are known to change the adsorption/diffusion behavior of carbon surfaces.

Figure 1B:
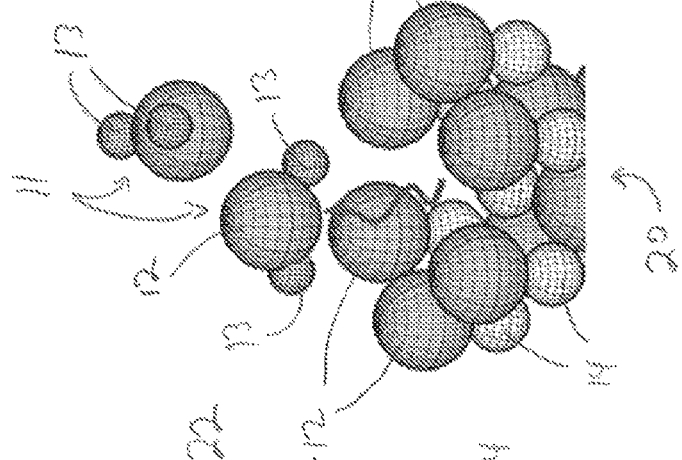
Figure 1A:
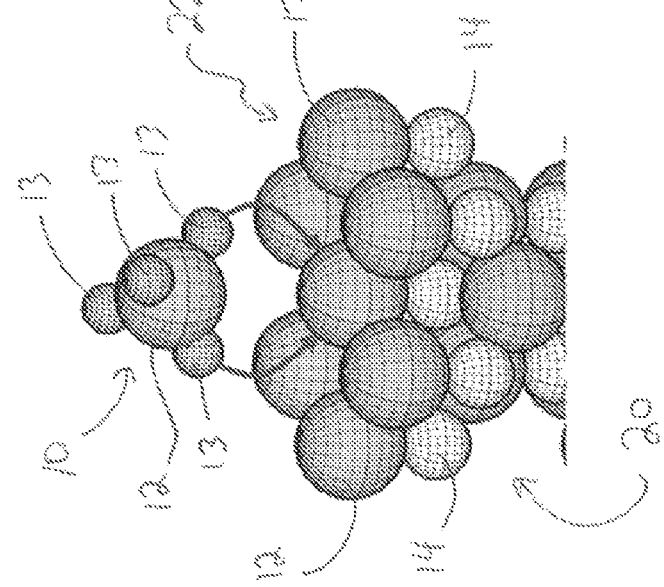

For example, as shown in the exemplary embodiment of FIGS. 1A-1C, a silicon tetrahalogen (10), having a Si atom (12) and four halogen atoms (13), reacts with solid Si (12) on the surface (22) of the SiC material (20) at the growth temperature (e.g., above 1150° C.) to form a silicon dihalide gas (11), such as silicon difluoride ($SiF_2$).

When the halogen species is fluorine, that is the reactive gas is silicon tetrafluoride, the reaction forms silicon difluoride as shown in reaction (2):

$$SiF_4(g) + Si(s) \rightarrow 2SiF_2 \qquad (2)$$

In this process, the silicon atoms are carried away from the SiC surface as $SiF_2$ gas and remove Si liquid on the substrate to assist and enhance graphene epitaxy on SiC. The present inventors have found that this process is Si selective, such that the carbon remains on the surface while Si is removed efficiently unlike other (e.g. hydrogen, HCl) etching methods.

Figure 4:
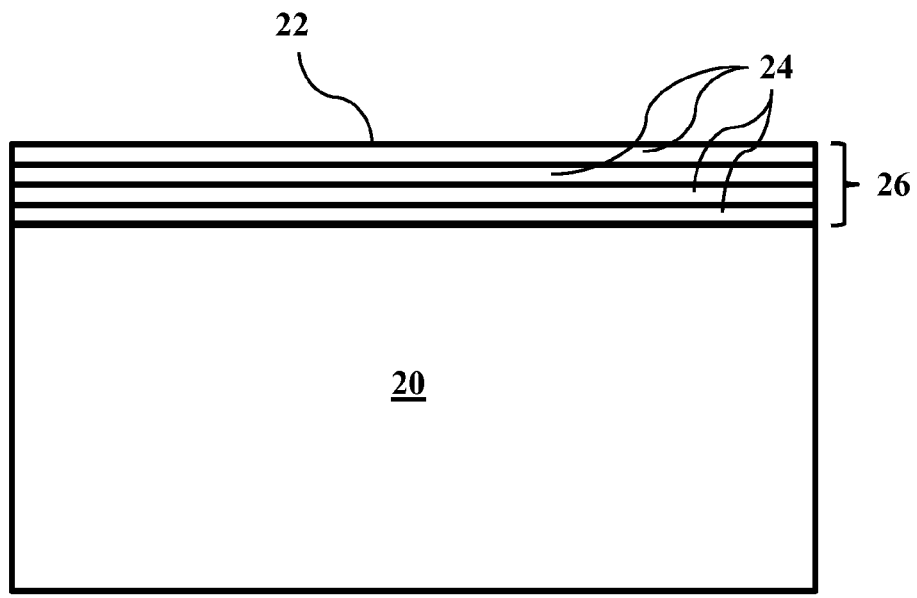
FIG. 4 shows a general cross-section of a SiC material having a plurality of graphene layers thereon to form a multilayer graphene film.

Thus, according to this process, referring to FIG. 1C, a layer of graphene (24) is formed on the silicon carbide material (20). As the reaction progresses, a plurality of graphene layers (24) are formed on the surface (22) of the SiC material (20) to define a multilayer graphene film (26) having a thickness (t), as schematically shown in FIG. 4.

By including small partial pressures of halogenated silanes (about $10^{-4}$ to about $10^2$ Torr), preferably fluorinated silanes (e.g. $SiF_4$) diluted in an inert ambient in the system, graphene with different thickness (few mono layers to several microns) epitaxial films can be grown. Inert ambients (e.g., Ar, He, Xe, $N_2$, etc., or mixtures thereof) can be used during the growth. The grown layers break the trade-off between material quality and thickness described above.

Fluorine can be introduced into the system during growth via the use of a silicon source gas that also includes fluorine (e.g., $SiF_4$) or via the use of a silicon source gas in combination with a fluorine source gas in an inert ambient or via the use of other fluorinated etchants (e.g. HF, $CF_4$ etc.).

In one embodiment, the growth atmosphere is substantially free from any etchant that reacts with carbon in the silicon carbide material, which, if present, would serve to remove carbon from the silicon carbide. For example, the growth atmosphere can be substantially free from a hydrogen species, an oxygen species, etc. That is, the removal process of Si cannot be enhanced by $H_2$ addition since the formation free energy of silicon hydrides are higher than the formation of Si gas from liquid. Thus, $H_2$ cannot be used since it removes the C, and not Si, from the surface by forming $C_2H_2$ gas. As used herein, the term "substantially free" means no more than an insignificant trace amount present and encompasses completely free (e.g., 0% by volume up to 0.00001% by volume).

IV. Resulting Multilayer Graphene Films

According to the above described methods, the resulting multilayer graphene film (formed from a plurality of graphene layers) on the surface of the SiC material can be formed to a desired thickness with controlled defects therein. The thickness of the multilayer graphene film can be controlled from a single monolayer having a thickness of a few nanometers to the millimeter scale (e.g., from a graphene monolayer to about 100 μm), and can be controlled through the growth temperature and the flow rate of the halogen species (e.g., $SiF_4$).

The amount of defects in the multilayer graphene film can be controlled as a function of (1) the growth temperature, (2) the flow rate of the halogen species gas, and (3) the orientation of the SiC substrate. For example, increasing the growth temperature and/or the flow rate of the halogen species results in an increase in the growth rate.

In one embodiment, the multilayer graphene film can be formed without any substantial defects thereon (i.e., zero defects). For example, defect densities can be characterized using Raman spectroscopy, which is a chemical technique convenient for measuring the amount of defects and well known to those skilled in the state of the art. In short, there are 2 peaks that emerge from this measurement, namely the graphene G peak, and the defect induced D-peak. The ratio of these two peak intensities maps directly to a defect density. Raman spectroscopy is convenient because it is fast, non-destructive and very accurate, if properly calibrated, as it also gives information on the stacking sequence and overall structural integrity of the multilayer graphene films. Other techniques may also be employed e.g., structural techniques such as X-ray diffraction, or imaging techniques such as transmission electron microscopy and scanning probe microscopy that enable direct visualization of defects. Generally, these techniques are correlated against each other in the early stages of process development, after which, it is sufficient to rely on Raman spectroscopy alone.

V. Patterned Multilayer Graphene Film

In one embodiment, a patterned multilayer graphene film can be formed on the surface of the SiC material, utilizing photolithography methods. For example, photolithography methods can be utilized to remove the multilayer graphene film, after its formation, from part of the surface of the SiC material, while leaving the multilayer graphene film on other areas of the SiC material. In an alternative patterning method, lithography methods can be utilized to block graphene growth on certain areas of the surface of the SiC material during the formation of the multilayer graphene film.

For example, refractory metals such as tantalum and tungsten can also be used as sacrificial multilayer graphene formation masks for selective formation of multilayer graphene. While any refractory metal can be used, the use of tantalum is particularly suitable as it is a material native to many high temperature reactors used for this growth. Such a refractory metal mask prevents graphene formation during the process, and this sacrificial mask is then removed after multilayer graphene formation.

Tantalum is easily deposited using lithography and e-beam evaporation in a preparation step known as "lift-off" to those skilled in the art. Alternately, tantalum can be deposited over the entire SiC surface, and removed selectively using wet-etches for tantalum e.g., aqua regia, or dry etching plasma processes.

After graphene growth, it is possible that the surface of the tantalum mask has converted to TaC, although this is only a surface coating. The underlying metallic tantalum can be used to remove the entire film using well-known chemical wet-etches e.g. aqua regia, without damaging the formed multilayer graphene.

Figure 5A:
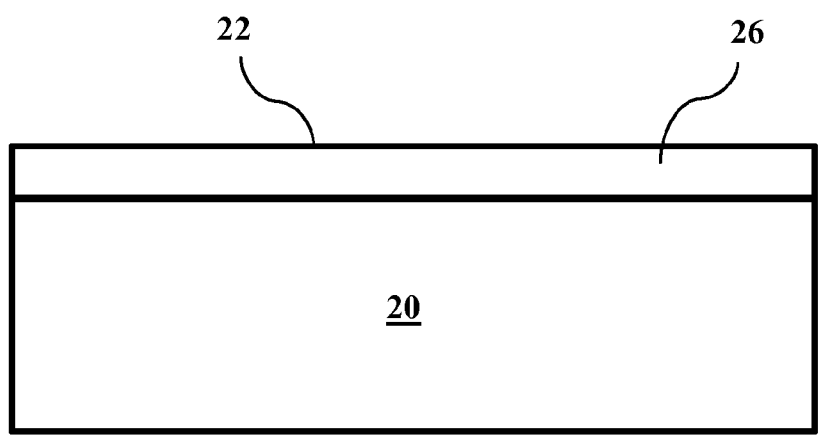
FIGS. 5A-5E show an exemplary method for sequentially forming a patterned graphite coating on a SiC material.
Figure 5B:
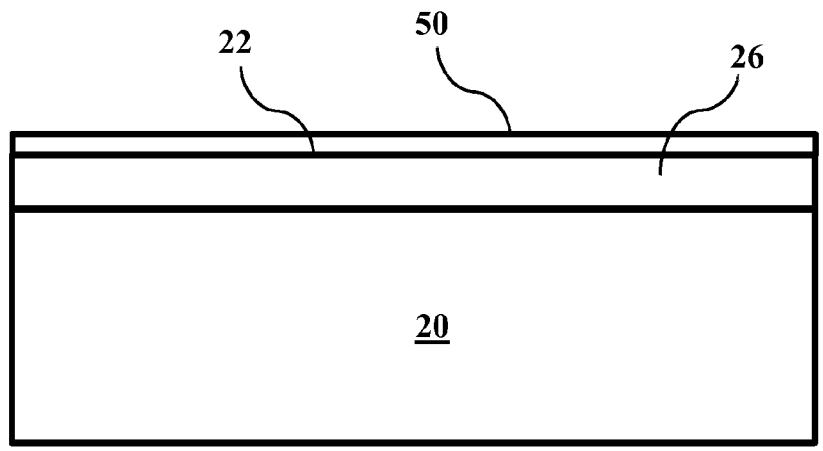
Figure 5C:
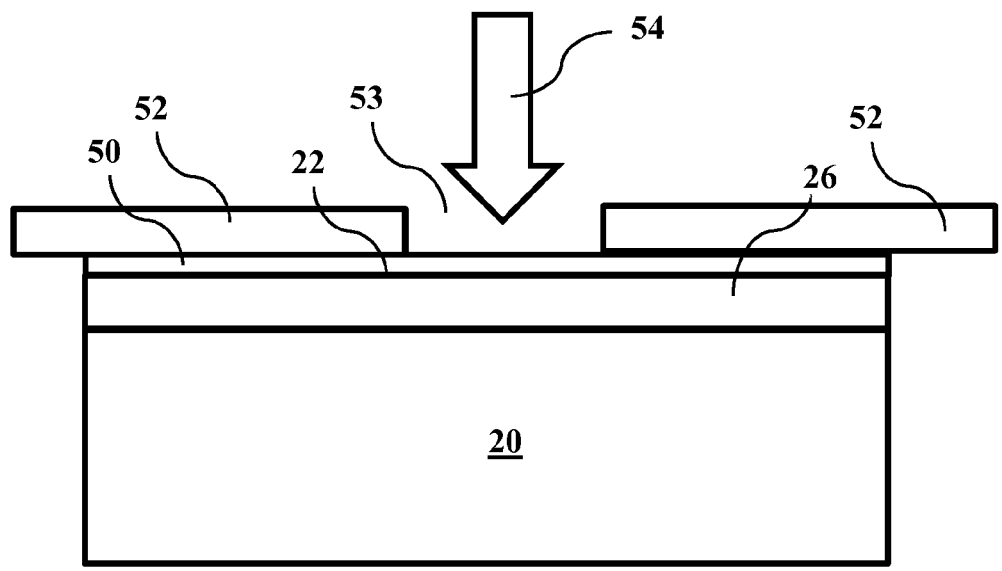
Figure 5D:
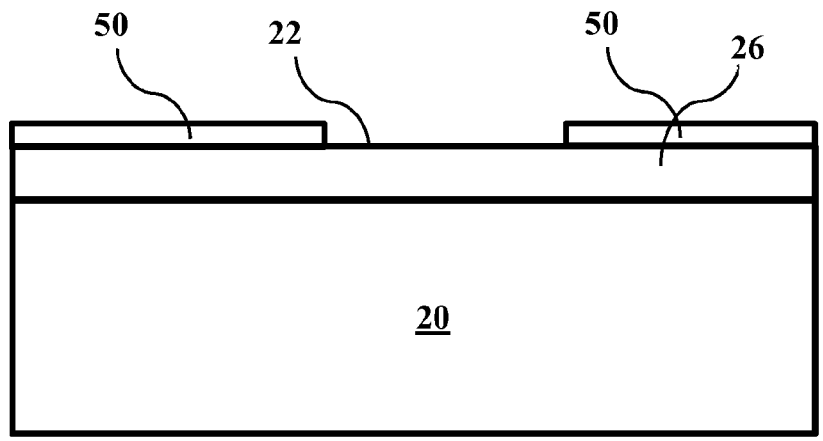
Figure 5E:
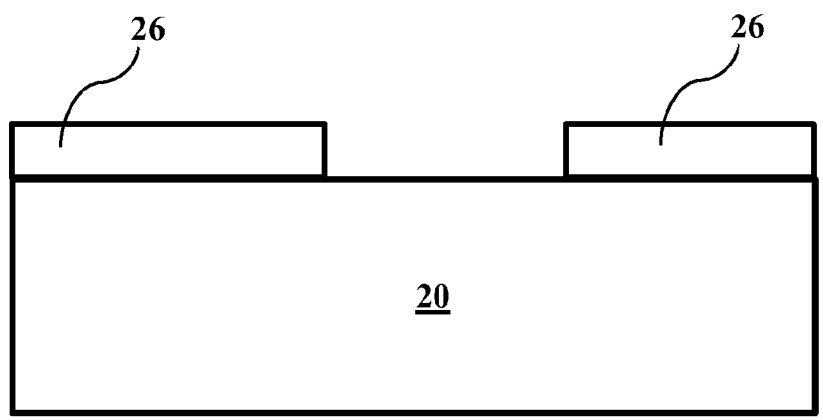

For example, in one embodiment to form patterned MLG, referring to the method sequentially shown in FIGS. 5A-5E, the MLG (26) is uniformly formed over the surface (22) of the SiC material (20). Then, select area(s) of the MLG (26) are removed from the SiC material (20) using lithography techniques. In one embodiment, a photo-resist coating (50) is applied uniformly over the graphite coating (26), such as shown in FIG. 5B. As is well known in the art, exposing such photo-resist layers to ultra-violet radiation 54 (e.g., wavelengths around 365 nm), the photo-resist 50 can be developed, and a pattern can be formed utilizing a mask 52 defining openings 53 therein. After development, the exposed MLG not covered by photo-resist is removed, as shown in FIG. 5D. In one embodiment, this etching is carried out using reactive ion etching (RIE) in $O_2$ plasma. After removal of MLG by etching, the remaining photoresist is stripped using solvents e.g., acetone and methanol well known to those skilled in the art, to form the patterned MLG layer 26 on the SiC material 20.

EXAMPLES

Experiments were conducted in a hotwall CVD reactor. Silicon tetrafluoride ($SiF_4$), as an exemplary halogen gas, was used as the gas precursor for epitaxial graphene growth in an Ar ambient, via silicon dissociation. Growth temperature was tested for 1300° C., 1400° C., 1500° C. and 1600° C., and the reactor pressure was kept fixed at 300 Torr. In this process, Ar (as an exemplary inert gases) was flown at certain temperature, preferably above 1300° C. The graphene growth was initiated by turning on the $SiF_4$ flow. The thickness of the graphene layer formed was found to be dependent on time, temperature, $SiF_4$ concentration, and growth pressure.

Figure 2A:
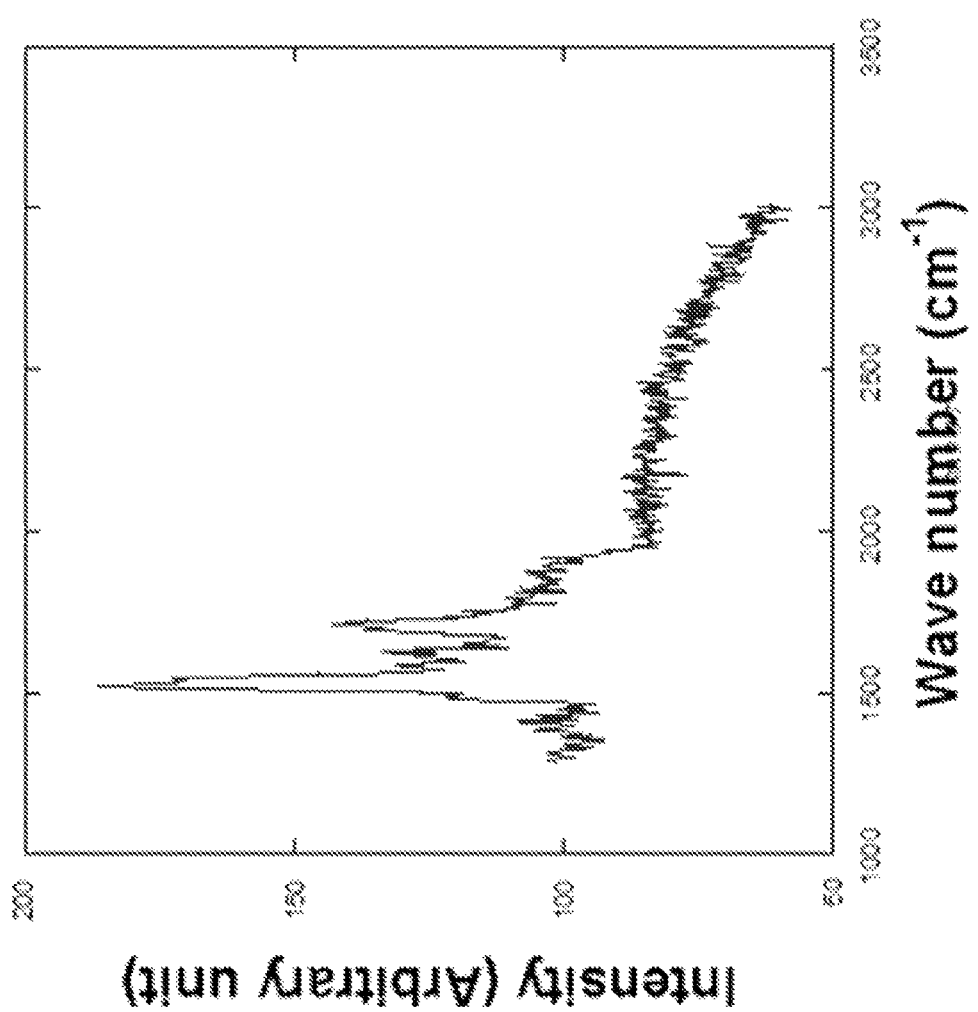
FIGS. 2A and 2B show a comparison of Raman analysis of surface treatment, with FIG. 2A showing the results of a surface treated for 1 hour at 10 slm of Ar flow rate without $SiF_4$ and FIG. 2B showing the results of a surface treated for 1 hour at 10 slm of Ar flow rate with a 10 sccm of $SiF_4$ flow rate.
Figure 2B:
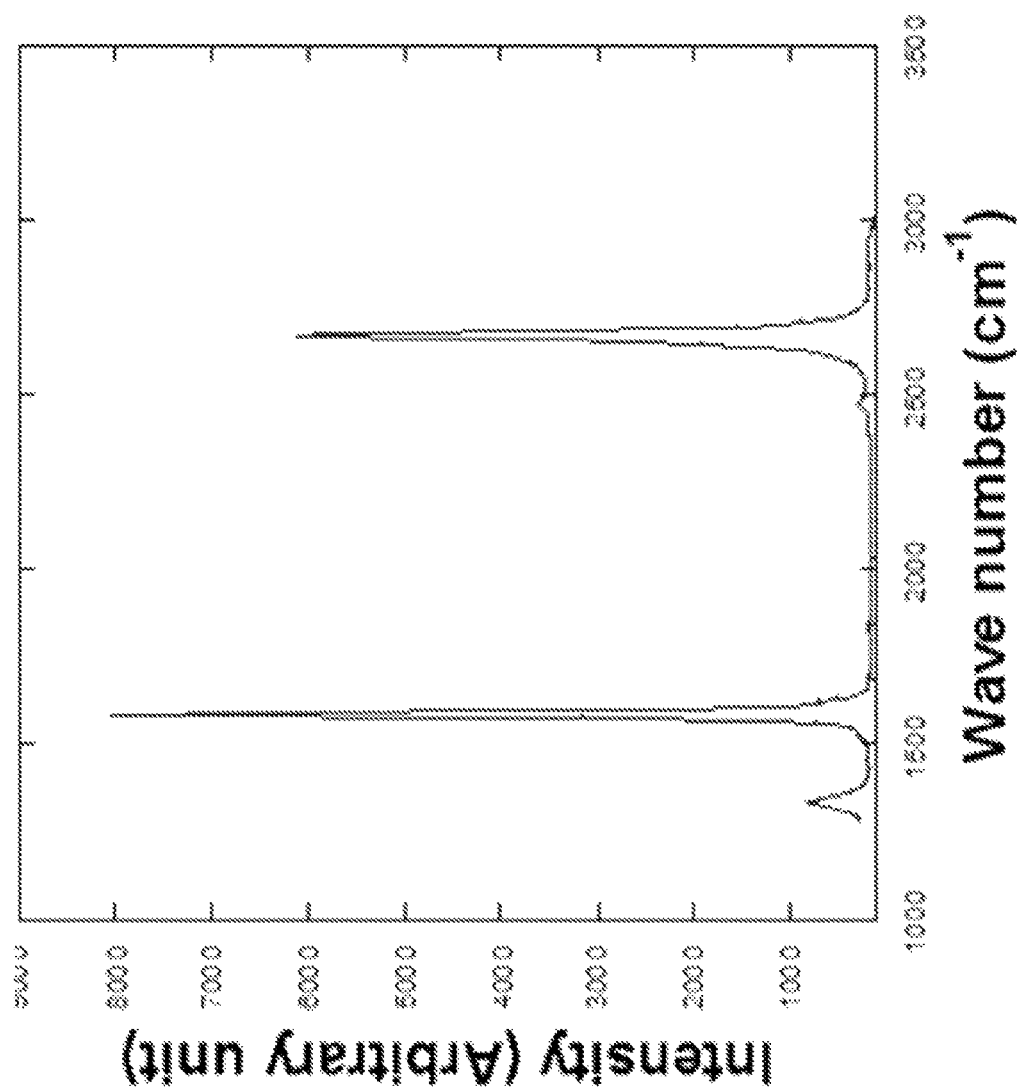

FIG. 2 illustrates the Raman signatures of samples grown with and without $SiF_4$ addition at 1600° C., just below the generally accepted optimized growth temperature for the growth of epitaxial graphene growth in Argon, which is about 1650° C. At 1600° C., without $SiF_4$, no growth of epitaxial graphene was observed, as measured by X-ray photoelectron spectroscopy (XPS). However, with the addition of about 0.1% $SiF_4$, a growth rate of about 100 ML/hr ("ML" means mono-layer) of epitaxial graphene was observed, much faster than any other technique previously used. Furthermore, this growth rate was obtained with extremely high quality, as determined by Raman spectroscopy, as shown in FIGS. 2A and 2B. The Raman spectrum of epitaxial graphene consists of the intrinsic G-peak (about 1580 $cm^{-1}$), the disorder D-peak at about 1350 $cm^{-1}$ and the double resonant, stacking dependent 2D-peak at about 2700 $cm^{-1}$. There were also several other overtones and combinations that were observed.

Raman analysis of the surfaces formed showed no graphene on the surface without $SiF_4$ present (FIG. 2A) and a thick multilayer graphene film on the surface after treatment with $SiF_4$ (FIG. 2B). The key Raman metrics that illustrate the quality of thick, high quality epitaxial graphene grown on SiC are:

a. very low ratio of D/G intensity ratio less than 0.2, comparable to the best in the literature;
b. extremely sharp 2D peak less than 40 $cm^{-1}$, suitable for electronic applications, illustrating the superior electronic properties of the grown graphene film;
c. symmetric 2D peak-indicates turbostratic stacking, preserving the "graphene-like" nature of the films vs. graphite like AB stacking, critical for an improvement over traditional graphite electrodes; and
d. no measurable peak at about 2950 $cm^{-1}$, indicating the planar registry of the film to the substrate, in the c-plane, which is very surprising considering the thickness of the grown films.

XPS and infrared reflectivity indicate that the growth rate can be controlled from about 0 ML/hr to 1000's ML/hr, by simply changing the flow rate of $SiF_4$. These all unequivocally demonstrate that the thickness/crystal quality tradeoff present for traditional epitaxial graphene growth has been broken.

The morphology of the graphene epilayers depended on various conditions, e.g. duration, Ar flow rates, temperature, $SiF_4$ flow rates.

Figure 3A:
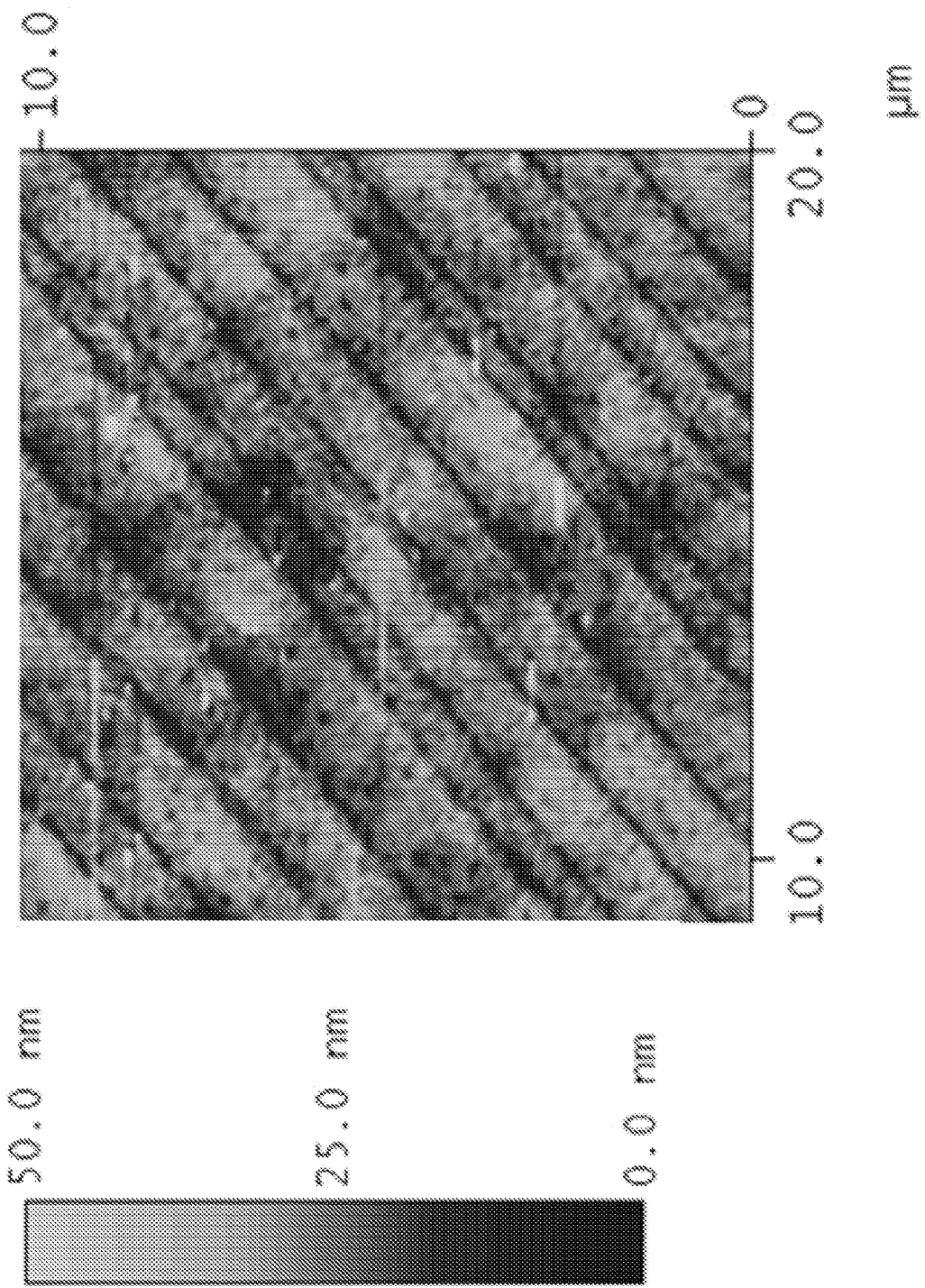
FIGS. 3A and 3B show AFM images of surfaces after epitaxial graphene growths using SiF4, where
Figure 3B:
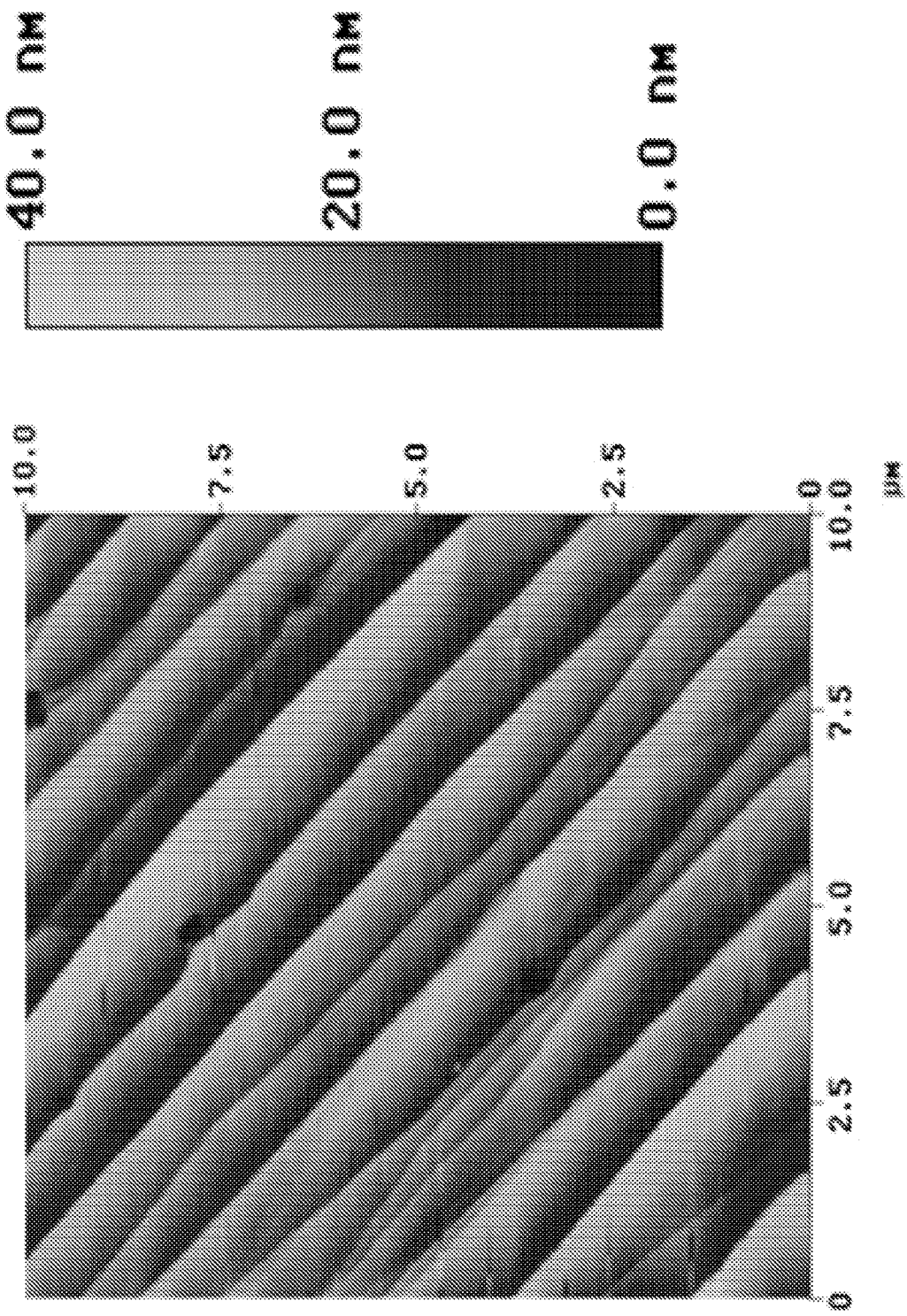

The morphology of optimized films measured by atomic force microscopy (AFM in FIG. 3) indicate step-flow mediated growth on the Si-face of 4H—SiC, similar to that seen for growth without $SiF_4$. The growth mechanism on other orientations of SiC is under investigation.

These and other modifications and variations to the present invention may be practiced by those of ordinary skill in the art, without departing from the spirit and scope of the present invention, which is more particularly set forth in the appended claims. In addition, it should be understood that the aspects of the various embodiments may be interchanged both in whole or in part. Furthermore, those of ordinary skill in the art will appreciate that the foregoing description is by way of example only, and is not intended to limit the invention so further described in the appended claims.

What is claimed is:

1. A method for forming a graphene film on a silicon carbide material, the method comprising:
    heating the silicon carbide material to a growth temperature, wherein the growth temperature is about 1,000° C. to about 2,200° C.; and
    exposing the silicon carbide material to a growth atmosphere comprising a halogen species, wherein the halogen species comprises silicon tetrafluoride, wherein the halogen species reacts with the silicon carbide material to remove silicon therefrom, and wherein the growth atmosphere has a partial pressure of the halogen species that is about $10^{-4}$ Torr to about 100 Torr, wherein the graphene film comprises a plurality of graphene layers with defects on the surface of the silicon carbide material as determined by the presence of a graphene G-peak and a defect induced D-peak when the graphene layers are characterized via Raman spectroscopy, wherein a ratio of the intensity of the D-peak to the G-peak is less than about 0.2, wherein the graphene film is a multilayer graphene film.

2. The method as in claim 1, wherein the growth temperature is about 1,300° C. to about 1,600° C.

3. The method as in claim 1, wherein the growth atmosphere is substantially free from any hydrogen species.

4. The method as in claim 1, wherein the growth atmosphere is substantially free from any hydrogen species and any oxygen species.

5. The method as in claim 1, wherein the silicon carbide material is heated in an inert gas atmosphere without any halogen species present.

6. The method as in claim 1, wherein the halogen species reacts with the silicon carbide material to remove silicon therefrom according to the equation:

$$SiF_4 + Si \rightarrow 2SiF_2.$$

7. The method as in claim 1, wherein the growth atmosphere consists essentially of the halogen species and at least one inert gas.

8. The method as in claim 1, wherein the growth atmosphere consists essentially of the halogen species and an inert gas selected from the group consisting of Ar, He, Xe, $N_2$, and mixtures thereof.

9. The method as in claim 1, further comprising:
    forming a pattern in the multilayer graphene film utilizing lithography.

10. The method as in claim 1, wherein the multilayer graphene film has a thickness of two graphene films to about 1 mm.

11. The method as in claim 1, wherein the multilayer graphene film has a thickness of two graphene films to about 1 μm.

12. The method as in claim 1, wherein the silicon carbide material a substrate, powder, granule, whisker, wire, coating, or a combination thereof.

* * * * *